(12) United States Patent
Nakabayashi et al.

(10) Patent No.: US 8,178,389 B2
(45) Date of Patent: May 15, 2012

(54) MONOCRYSTALLINE SILICON CARBIDE INGOT, MONOCRYSTALLINE SILICON CARBIDE WAFER AND METHOD OF MANUFACTURING THE SAME

(75) Inventors: Masashi Nakabayashi, Futtu (JP); Tatsuo Fujimoto, Futtu (JP); Mitsuru Sawamura, Futtu (JP); Noboru Ohtani, Futtu (JP)

(73) Assignee: Nippon Steel Corporation, Tokyo (JP)

( * ) Notice: Subject to any disclaimer, the term of this patent is extended or adjusted under 35 U.S.C. 154(b) by 41 days.

(21) Appl. No.: 12/708,124

(22) Filed: Feb. 18, 2010

(65) Prior Publication Data

US 2010/0147212 A1 Jun. 17, 2010

Related U.S. Application Data

(62) Division of application No. 11/663,887, filed as application No. PCT/JP2005/018732 on Oct. 5, 2005.

(30) Foreign Application Priority Data

Oct. 13, 2004 (JP) .................................. 2004-299088

(51) Int. Cl.
*H01L 21/00* (2006.01)
(52) U.S. Cl. ........................................ 438/105; 438/931
(58) Field of Classification Search .................. 438/105, 438/931; 117/104, 105, 107
See application file for complete search history.

(56) References Cited

U.S. PATENT DOCUMENTS

| | | | |
|---|---|---|---|
| 5,788,768 A | | 8/1998 | Barrett et al. |
| 5,856,231 A | | 1/1999 | Niemann et al. |
| 5,873,937 A | * | 2/1999 | Hopkins et al. ............... 117/105 |
| 5,895,526 A | * | 4/1999 | Kitoh et al. ..................... 117/84 |
| 5,964,944 A | * | 10/1999 | Sugiyama et al. ............ 117/107 |
| 6,824,611 B1 | * | 11/2004 | Kordina et al. ............... 117/107 |
| 2002/0083891 A1 | | 7/2002 | Vodakov et al. |

FOREIGN PATENT DOCUMENTS

| | | |
|---|---|---|
| JP | 63-50399 A | 3/1988 |
| JP | 9-500861 A | 1/1997 |
| JP | 2003-104798 A | 4/2003 |
| JP | 2004-200188 A | 7/2004 |

OTHER PUBLICATIONS

English Translation of Japanese Office Action mailed Aug. 18, 2009 issued in corresponding Japanese Patent application No. 2004-299088.

(Continued)

*Primary Examiner* — Kevin M Picardat
(74) *Attorney, Agent, or Firm* — Birch, Stewart, Kolasch & Birch, LLP

(57) ABSTRACT

Provided is a monocrystalline silicon carbide ingot containing a dopant element, wherein a maximum concentration of the dopant element is less than $5\times10^{17}$ atoms/cm$^3$ and the maximum concentration is 50 times or less than that of a minimum concentration of the dopant element. Also provided is a monocrystalline silicon carbide wafer made by cutting and polishing the monocrystalline silicon carbide ingot, wherein a electric resistivity at room temperature of the wafer is $5\times10^3$ Ωcm or more. Further provided is a method for manufacturing the monocrystalline silicon carbide including growing the monocrystalline silicon carbide on a seed crystal from a sublimation material by a sublimation method. The sublimation material includes a solid material containing a dopant element, and the specific surface of the solid material containing the dopant element is 0.5 m$^2$/g or less.

13 Claims, 3 Drawing Sheets

OTHER PUBLICATIONS

Bickermann M et al., Journal of Crystal Growth, Elsevier, vol. 254, No. 3-4, Jul. 2003, pp. 390-399.
Han R et al., Optical Materials, Elsevier Science Publishers B.V., vol. 23, No. 1-2, Jul. 2003, pp. 415-420.
Carter Jr et al., Materials Science and Engineering, B, Elsevier Sequoia, vol. 61-62, Jul. 30, 1999, pp. 1-8.
Yu.M. Tairov et al., Journal of Crystal Growth vol. 52 (1981) pp. 146-150.
Rutberg & Co., Gallium Niride: A Material Opportunity (2001).
S.A. Reshanov et al., Materials Science Forum vols. 353-356 (2001), pp. 53-56.
J. Timmler et al., J. Aerosol Sci., vol. 20, No. 8, pp. 1011-1014, 1989.
J. R. Jenny et al., Applied Physics Letters, vol. 68, No. 14, pp. 1963-1965 (Apr. 1, 1996).
M. Bickermann et al., Journal of Crystal Growth, 254 (2003), pp. 390-399.
First Action Interview Pilot Program Pre-Interview Communication issued Mar. 1, 2011 in U.S. Appl. No. 11/663,887.
Japanese Office Action mailed Aug. 18, 2009 issued in corresponding Japanese Patent application No. 2004-299088.

* cited by examiner

MONOCRYSTALLINE SILICON CARBIDE INGOT, MONOCRYSTALLINE SILICON CARBIDE WAFER AND METHOD OF MANUFACTURING THE SAME

This application is a Divisional of co-pending U.S. patent application Ser. No. 11/663,887, filed Mar. 27, 2007, which is the U.S. National Phase of PCT/JP2005/018732, filed Oct. 5, 2005. Priority is claimed thereto under 35 U.S.C. §120. This application also claims priority under 35 U.S.C. §119(a) to Japanese patent application No. 2004-299088, filed in Japan on Oct. 13, 2004. The entire contents of all are herein incorporated by reference.

FIELD OF THE INVENTION

The present invention relates to a monocrystalline silicon carbide with a uniform concentration of a dopant element, a wafer of the monocrystalline silicon carbide with a uniform concentration of a dopant element and a manufacturing method thereof. This invention is particularly suitable for high-resistance monocrystalline silicon carbide.

Silicon carbide (SiC) is a wide-gap semiconductor with a wide width of forbidden gap ranging from 2.2 to 3.3 eV. SiC has been studied as an environment-resistant semiconductor material since SiC has excellent physical and chemical properties. In particular, SiC has been recently actively researched with a focus on its application to short-wavelength optical devices and high frequency, high power electronic devices. In the application of monocrystalline SiC to the semiconductor field, high quality monocrystals with a large area are demanded. Also, for use as a substrate for a high frequency device, high electrical resistance is also required in addition to high crystal quality.

Conventionally, for research purposes, a sublimation method (Lely method) has been used for obtaining monocrystalline. SiC of a size that enables the preparation of a semiconductor element. However, this method can provide only an area of monocrystal that is small in size. In addition, it is difficult to control the dimension, shape, crystal polytypes and concentration of carrier impurities. On the other hand, a CVD method has been used to form and grow cubic monocrystalline SiC on a heterogeneous substrate, such as Si using heteroepitaxial growth. This method can provide an area of monocrystal that is large in size. However, since the lattice mismatch between SiC and Si reaches about 20%, the obtained monocrystalline SiC includes many defects (up to $10^7/cm^2$), which is far from a high quality monocrystal. To solve these problems, a modified Lely method where sublimation-re-crystallization is performed using monocrystalline SiC as a seed crystal is proposed (Yu. M. Tairov and V. F. Tsvetkov, Journal of Crystal Growth, Vol. 52 (1981) pp. 146-150). This modified Lely method enables the growth of monocrystalline SiC with control of crystal polytypes (6H type, 4H type, 15R type etc.), shape, carrier type and concentration.

Currently, monocrystalline SiC wafers of diameters ranging from 2 inches (50 mm) to 3 inches (75 mm) are cut from a monocrystalline SiC made by the modified Lely method. This is used for manufacturing devices in the field of power electronics. In the practical application to devices, depending upon the intended purpose, it is necessary to adjust the conductivity type and/or resistivity of the crystal. This is usually accomplished by controlling the kind and concentration of dopant. However it is very difficult to uniformly dope the crystal when the vapor pressure of the dopant is greatly different from that of SiC. As an example, a SiC wafer for high frequency devices is described below.

Recently, gallium nitride (GaN), which has superior properties to that of silicon (Si) or gallium arsenide (GaAs), has drawn attention. Rutberg & Co. Gallium Nitride: A Material Opportunity (2001) discusses gallium nitride as a material for high frequency semiconductor devices. In order to make a GaN device, it is necessary to form a monocrystalline thin film of GaN on a monocrystalline substrate. A sapphire substrate is one of the more common substrates. Sapphire has the advantage of being useful to stably manufacture a monocrystal with fairly good quality. However, the difference in lattice constant value between sapphire and GaN is 13.8%. This tends to cause deterioration of the GaN thin film. Also, sapphire has a problem concerning heat release during operation of the device since the heat conductivity is as low as 0.42 W/cm·K. Thus, at present, GaN high frequency devices do not allow perfect function. On the other hand, the difference in the lattice constant value between monocrystalline SiC and GaN is as small as 3.4%, which makes it possible to form a high quality GaN thin film. Also, the heat conductivity of monocrystalline SiC is as high as 3.3 W/cm·K, which provides good heat release. Therefore, since major improvements can be expected if monocrystalline SiC is used as a substrate, the employment of monocrystalline SiC substrates have been recently desired in the field of GaN high frequency devices.

In the field of GaN high frequency devices, in addition to a high quality crystal, the monocrystalline substrate used for the device is required to have a high resistivity ($5\times10^3$ Ωcm or more, preferably $1\times10^5$ Ωcm or more). This is required to reduce the parasitic capacitance of each element formed on the substrate and to have a separation/isolation between the elements. Presently, substrates of high-resistance monocrystalline SiC are industrially obtained by forming a deep level in the forbidden gap of monocrystalline SiC using a particular method. For example, it is known that vanadium is capable of forming a deep donor level, or a deep acceptor level in SiC crystals to compensate shallow donor or shallow acceptor impurities unavoidably introduced in the crystals. This causes the crystals to have high resistivity. More specifically, for example as disclosed in "S. A. Reshanov et al., Materials Science Forum, Vols. 353-356 (2001) pp. 53-56", a vanadium-added (doped) crystal is obtained by preparing a mixture of SiC powder material and metal vanadium or vanadium compounds (silicide, oxide, etc.) and sublimating the vanadium together with the SiC material. With respect to a monocrystalline SiC ingot prepared in the manner above, however, the quality of the crystal is low and only an extremely limited portion of the monocrystalline ingot has high-resistivity. This is because the sublimation rate or evaporation rate of the vanadium is very high compared to the sublimation rate of the SiC material. Vanadium with a high sublimation rate is introduced into monocrystalline SiC at a high concentration at an initial growing stage of the monocrystalline SiC. As a result, the introduced amount of vanadium exceeds the maximum solubility (solubility limit) of vanadium in the SiC ($3-5\times10^{17}$ atoms/cm$^3$) (see "J. R. Jenny et al., Applied Physics Letters, Vol. 68, No. 14, pp. 1963-1965 (1996)"), and excess vanadium is precipitated in the monocrystalline SiC as compound. This provides a starting point for crystal defect, which degrades the quality of the subsequently grown monocrystalline SiC. Further, at a late stage of the monocrystal growth, the vanadium source becomes so short that the vanadium concentration in the monocrystalline SiC at the late stage of growth becomes insufficient to compensate for carrier impurities. Thus, vanadium-added (doped) crystal made by conventional manners is poor in crystal quality. Also, there can only be provided a limited number of high-resistant wafers from one monocrystalline ingot.

The Japanese translation of PCT international application 9-500861 discloses technology by which vanadium-added (doped) higher-resistant crystal can be obtained. In this technology, nitrogen, which is a typical impurity of SiC, is overcompensated for by the addition of a trivalent element with shallow acceptor levels which changes the conductivity type from n- to p-conductivity. Further, a transition element such as vanadium is placed at the donor level. However, a problem of non-uniformity of vanadium concentration still exists in this technology and the essential problems of vanadium-added (doped) crystal such as crystal quality and yield remain unchanged.

As described above, presently the yield of wafers from vanadium doped monocrystalline SiC ingots made by conventional methods is low and the quality does not meet the high requirements in the semiconductor field.

SUMMARY OF THE INVENTION

A monocrystalline SiC ingot made by conventional methods is a crystal with low quality caused by the non-uniformity of concentration of a dopant material. Further, the portion of the crystal having the desired properties is only a limited part of the monocrystalline ingot. An object of the present invention is to solve the problems described above and to provide a monocrystalline SiC ingot from which SiC wafers with high quality and intended properties can be made at high yield ratio, and a method for manufacturing the same.

The inventors have diligently conducted research to solve these problems and have discovered a technology for manufacturing a high quality monocrystalline SiC ingot by doping a dopant material uniformly into the monocrystalline SiC. That is, the present invention is as follows.

Item 1. A monocrystalline silicon carbide ingot containing a dopant element, wherein a maximum concentration of the dopant element is less than $5 \times 10^{17}$ atoms/cm$^3$ and the maximum concentration is 50 times or less than a minimum concentration of the dopant element.

Item 2. The monocrystalline silicon carbide ingot according to item 1 above, wherein the maximum concentration is 10 times or less than the minimum concentration of the dopant element.

Item 3. The monocrystalline silicon carbide ingot according to item 1 above, wherein the maximum concentration is 2 times or less than the minimum concentration of the dopant element.

Item 4. The monocrystalline silicon carbide ingot as in item 1 above, wherein the minimum concentration of the dopant element is $5 \times 10^{14}$ atoms/cm$^3$ or more.

Item 5. The monocrystalline silicon carbide ingot as in item 1 above, wherein the minimum concentration of the dopant element is $1 \times 10^{15}$ atoms/cm$^3$ or more.

Item 6. The monocrystalline silicon carbide ingot as in item 1 above, wherein the minimum concentration of the dopant element is $1 \times 10^{16}$ atoms/cm$^3$ or more.

Item 7. The monocrystalline silicon carbide ingot as in item 1 above, wherein the dopant element is vanadium.

Item 8. The monocrystalline silicon carbide ingot according to item 7 above, wherein a conductivity type of the monocrystalline silicon carbide is n-type.

Item 9. The monocrystalline silicon carbide ingot as in item 1 above, wherein a primary polytype of the monocrystalline silicon carbide is any one of 3C, 4H, 6H or 15R.

Item 10. The monocrystalline silicon carbide ingot as in item 1 above, wherein a primary polytype of the monocrystalline silicon carbide is 4H.

Item 11. A monocrystalline silicon carbide wafer made by cutting and polishing the monocrystalline silicon carbide ingot as item 1 above, wherein an electric resistivity at room temperature of the wafer is $5 \times 10^3$ Ωcm or more.

Item 12. The monocrystalline silicon carbide wafer made by cutting and polishing the monocrystalline silicon carbide ingot as item 1 above, wherein an electric resistivity at room temperature of the wafer is $1 \times 10^5$ Ωcm or more.

Item 13. The monocrystalline silicon carbide wafer as in item 11 above, wherein the wafer consists of a single polytype of 3C, 4H, 6H or 15R.

Item 14. The monocrystalline silicon carbide wafer as in item 11 above, wherein the wafer consists of a single polytype of 4H.

Item 15. The monocrystalline silicon carbide wafer as in item 11 above, wherein a diameter of the wafer is 50 mm or more.

Item 16. The monocrystalline silicon carbide wafer as in item 11 above, wherein a diameter of the wafer is 100 mm or more.

Item 17. An epitaxial wafer comprising the monocrystalline silicon carbide wafer as in item 11 above, and a silicon carbide thin film formed thereon using epitaxial growth.

Item 18. An epitaxial wafer comprising the monocrystalline silicon carbide wafer as in item 11 above, and a thin film of gallium nitride, aluminum nitride, indium nitride or a mixed crystal thereof formed on the monocrystalline silicon carbide wafer using epitaxial growth.

Item 19. A method for manufacturing a monocrystalline silicon carbide comprising a step of:

growing a monocrystalline silicon carbide on a seed crystal from a sublimation material by a sublimation method, wherein the sublimation material includes a solid material containing a dopant element, and wherein a specific surface of the solid material containing the dopant element is 0.5 m$^2$/g or less.

Item 20. A method for manufacturing a monocrystalline silicon carbide comprising a step of:

growing a monocrystalline silicon carbide on a seed crystal from a sublimation material by a sublimation method, wherein the sublimation material includes a solid material containing a dopant element, and wherein the solid material containing the dopant element can reduce the specific surface to 0.5 m$^2$/g or less at a temperature of 2400° C. or less.

Item 21. The method for manufacturing a monocrystalline silicon carbide as in item 19 above, wherein the sublimation material is a mixture of the solid material containing the dopant element and silicon carbide powder or silicon carbide raw material powder prepared in advance.

Item 22. The method for manufacturing monocrystalline silicon carbide as in item 19 above, wherein the sublimation material consists of the solid material containing the dopant element and silicon carbide powder or silicon carbide raw material powder where the solid material containing the dopant element and the silicon carbide powder or the silicon carbide raw material powder are placed separately from each other.

Item 23. The method for manufacturing a monocrystalline silicon carbide as in item 19 above, wherein the solid material containing the dopant element has a specific surface of 0.1 m$^2$/g or less.

Item 24. The method for manufacturing a monocrystalline silicon carbide as in item 19 above, wherein the solid material containing the dopant element has a specific surface of 0.05 m$^2$/g or less.

Item 25. The method for manufacturing a monocrystalline silicon carbide as in item 19 above, wherein the dopant element is vanadium.

Item 26. A method for forming a monocrystalline silicon carbide (SiC) on a seed crystal of monocrystalline SiC by sublimation-re-crystallizing a sublimation material under reduced pressure of an inert gas atmosphere wherein the sublimation material includes SiC and solid material containing vanadium as a dopant element which ranges from 0.001 to 1.0 weigh % of SiC in terms of vanadium comprising the steps of:

(a) treating the vanadium carbide as dopant so as to adjust a specific surface of the vanadium carbide to 0.001 m$^2$/g or more and 0.5 m$^2$/g or less, and (b) sublimation-re-crystallizing the sublimation material to form the monocrystalline SiC on the seed crystal of monocrystalline SiC.

Item 27. The method according to item 26, wherein the sublimation material comprises SiC and vanadium carbide excluding any acceptor element for transforming a conductivity type of monocrystalline SiC to p-type.

Item 28. The method according to item 26, wherein the step of sublimation-re-crystallizing is conducted after mixing the vanadium carbide of which specific surface is 0.001 m$^2$/g or more and 0.5 m$^2$/g or less with SiC.

Item 29. 29. The method according to item 26, wherein the step of sublimation-re-crystallizing is conducted by increasing the temperature both of the solid material containing vanadium as a dopant element and the SiC after the solid material and the SiC are placed separately and then is heated to a temperature below 2400° C. so that the specific surface becomes 0.001 m$^2$/g or more and 0.5 m$^2$/g or less.

Item 30. The method according to item 26, wherein the step of treating the vanadium carbide as a dopant so as to adjust a specific surface of the vanadium carbide to 0.001 m$^2$/g or more and 0.5 m$^2$/g or less includes heat treatment.

Item 31. The method according to item 30, wherein the heat treatment is sintering or melting.

Figure 1:
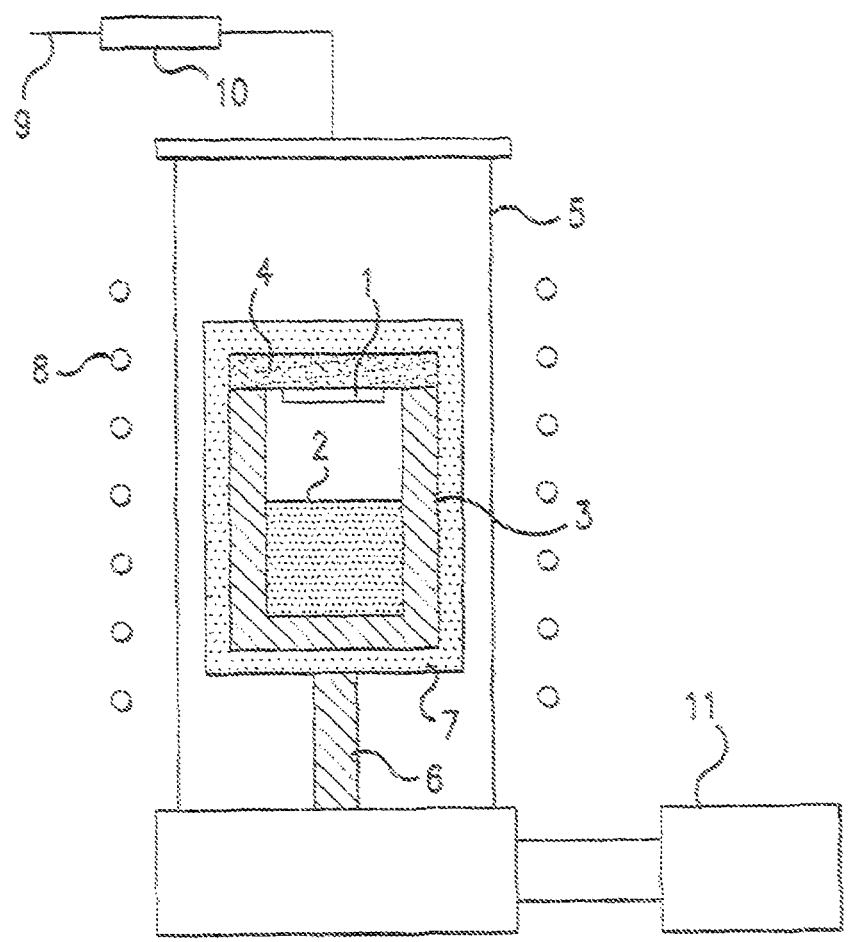
FIG. 1 is a schematic diagram of a monocrystal manufacturing apparatus used for manufacturing the crystal of the present invention.

According to the present invention, a monocrystalline SiC ingot having a uniform concentration of a dopant element and high crystal quality can be prepared. When vanadium is used as the dopant element, monocrystalline SiC wafers with high crystal quality can be manufactured from the single crystal ingot at high yield.

DETAILED DESCRIPTION. OF PREFERRED EMBODIMENTS

When referring to "room temperature", this is generally meant to refer to a temperature ranging from about 0° C. to about 30° C.

Precipitation of dopant element compounds in the monocrystalline SiC can be starting points of foreign polytypes and micropipes. This is suppressed by keeping the maximum dopant element concentration to less than $5 \times 10^{17}$ atoms/cm$^3$. If the maximum dopant element concentration in the monocrystalline SiC ingot is kept at 50 times the minimum dopant element concentration or less, preferably 10 times or less, more preferably 2 times or less, and also the minimum dopant element concentration is kept at $5 \times 10^{14}$ atoms/cm$^3$ or more, preferably $1 \times 10^{15}$ atoms/cm$^3$ or more, more preferably $1 \times 10^{16}$ atoms/cm$^3$, the desired properties can be obtained in the entire ingot or substantially the entire ingot. Thus, a high quality wafer can be manufactured at high yield. The wafer is prepared using existing cutting processes (e.g., wire saw process), and polishing processes (e.g., lapping and/or polishing).

When using vanadium as a dopant element, vanadium can compensate for impurities over a wide area in the monocrystalline SiC ingot. This can make all or substantially all of the wafer prepared from the monocrystalline SiC ingot of a high-resistivity of $5 \times 10^3$ Ωcm or more, preferably $1 \times 10^5$ Ωcm or more. Since higher resistivity is advantageous in application to high frequency devices, there is no upper limit of resistivity of the monocrystalline SiC wafer of the present invention. However, it is thought that the resistivity of monocrystalline. SiC can be theoretically increased up to $1 \times 10^{20} - 1 \times 10^{25}$ Ωcm. There is no specific limitation on kinds of impurities to be compensated for with vanadium. A typical impurity of SiC is nitrogen of a donor element and when the monocrystalline SiC is manufactured by a sublimation method, the conductivity type of the grown crystal is normally n-type. When obtaining a higher resistivity by using a vanadium donor level capable of forming a deeper level, the conductivity type of the crystal has to be changed to p-type by adding an acceptor element such as boron or aluminum to the monocrystalline SiC. However, sufficiently high resistivity can be obtained in the present invention even if the conductivity type of crystal is n-type. Therefore, an acceptor element does not need to be added and the process can be simplified accordingly.

The monocrystalline SiC of the present invention can be made of any one of 3C, 4H, 6H or 15R polytypes each of which is currently highly expected to be applied to the device. Among them, the 4H polytype is particularly expected to have an excellent device property. A 4H polytype has the nature that nitrogen is easily introduced therein during crystal growth, which has made it difficult to realize high-resistivity by conventional methods. However, the present invention can work well even on a 4H polytype. Considering the application to devices, a wafer of monocrystalline SiC should preferably be made of a single polytype. In the monocrystalline SiC ingot of the present invention, there is no formation of precipitate, which may be the cause of foreign polytypes. Therefore, there is little or no foreign polytypes in the entire area of the present ingot, which leads to a high yield of single polytype wafer. As for the diameter of the monocrystalline SIC, generally in conventional technology the larger the ingot diameter becomes, the lower the wafer yield becomes. However, in the present invention, a high wafer yield can be stably obtained with respect to a large diameter ingot of which diameter is 50 mm or more, even 100 mm or more. Although there is no specific upper limit to the diameter, it is not preferable in a modified Lely method to attempt an ingot of which diameter exceeds 300 mm since the control of mass transfer becomes extremely difficult.

The monocrystalline SiC wafer of the present invention, which has high resistivity and high crystal quality, can be applied to a substrate for a high frequency and/or a high power device. An epitaxial wafer, made by forming a monocrystalline SiC thin layer using a CVD method on a monocrystalline SiC wafer of the present invention, or made by using epitaxial growth of gallium nitride, aluminum nitride, indium nitride or a mixed crystal thereof, have excellent properties (e.g., surface morphology of thin film (layer), electrical property, etc.) since the crystal quality of the monocrystalline SiC wafer substrate is excellent.

As for a method for manufacturing the monocrystalline SiC, it is effective for a sublimation material to include a solid material, with a dopant element, of which specific surface is 0.5 $m^2/g$ or less, preferably 0.1 $m^2/g$ or less, more preferably 0.05 $m^2/g$ or less. The sublimation/evaporation phenomena of particles have a close relation to the particle size of the particles. As described in, for example, "J. Timmler and P. Roth, Journal of Aerosol Science, vol. 80, No. 3 (1989) pp. 1011-1014", the smaller the particle size, the larger the sublimation rate (sublimating mass per unit time). Generally, a solid material of small size, i.e., a solid material with a large specific surface, sublimates at a very high rate at the initial stage of sublimation. Then, the sublimation rate drastically slows as the amount of the solid material reduces. On the contrary, in a solid material with a small specific surface, which sublimates at a low rate and of which the amount of the solid material reduces slowly, the change in the sublimation rate is small. If the specific surface of the solid material containing the dopant element is adjusted to the range mentioned above, an almost constant sublimation or evaporation rate of the dopant element can be maintained during monocrystalline SiC growth without depletion of the dopant source at a late stage. This enables the manufacture of a monocrystalline SiC ingot having a uniform dopant concentration over the entire area of the ingot. The ratio of the solid material to the silicon carbide material in the sublimation raw material is determined considering the kind of dopant element, the kind and specific surface of the solid material, and the desired dopant concentration in the SiC crystal. When vanadium is used as a dopant element, the appropriate ratio between silicon carbide and vanadium contained in the solid material is as follows: (silicon carbide material by mass):(vanadium by mass contained in solid material)=100:0.001-1.0. This ratio range can also be applied to other dopants. Although there is no specific lower limit for the value of the specific surface of the solid material, solid material with too small a specific surface should not be used because the sublimation rate becomes extremely low. This makes it difficult to obtain the necessary concentration of dopant. The specific surface should preferably be 0.001 $m^2/g$ or more. Commercially available solid material containing a dopant element to be added to the sublimation material usually has a specific surface exceeding an upper limit value 0.5 $m^2/g$ of the present invention. For example, as for vanadium, commercially available material has a specific surface of 2-10 $m^2/g$ or more and a particle size of about 1-5 μm. Therefore, for the solid material containing a dopant element to be added, the solid material has to have heat treatment such as sintering or melting so as to adjust the specific surface. The solid material can be heat-treated before being mixed with silicon carbide. However, if the solid material containing the dopant element of interest can be heat-treated (melting or sintering) at a lower temperature than the sublimation temperature of SiC (about 2400° C.) to reduce the specific surface and intended specific surface can be obtained thereby, the heat-treatment process can be incorporated in the manufacturing process of the monocrystalline SiC ingot. This simplifies the total process. In this case, the solid material containing the dopant element is applied isolated from the SiC powder so that each of the particles of the solid material containing the dopant element can contact each other. This can effectively reduce the specific surface before sublimation. More specifically, for example, a heat-resistant container is mounted inside or outside of a growing crucible to accommodate the solid material containing the dopant element. Or, the crystal-growing crucible can be designed to have at least two separate spaces (compartments) to separately accommodate the solid material containing the dopant element and the SiC powder.

Similar technology to separating the locations of the material containing the dopant element and the SiC powder is described in "M. Bickermann et al., Journal of Crystal Growth, 254 (2003) p.p. 390-399". In this reference, although there is no clear description of the mechanism of uniform doping, it seems to be clear that fine pores existing in the graphite form paths for mass transfer. This controls mass transfer from the inside to the outside of the container to some extent, and leads to a uniform dopant concentration of vanadium in the monocrystalline SiC. In the present invention, the dopant concentration is controlled by adjusting the specific surface of the solid material containing the dopant element, which is a totally different technology from that described in this reference.

EXAMPLES

The present invention is described below by way of examples. Examples of the present invention and comparative examples are prepared using a crystal growing apparatus for a modified Lely method as shown in FIG. 1. Crystal growth is performed by sublimating a sublimation material 2 by induction heating to recrystallize on a seed crystal 1.

Example 1

The crystal of example 1 is prepared by a method where a SiC material is mixed in advance with a solid material containing a dopant element of which the specific surface is within the range of the present invention. Vanadium carbide is used as the solid material containing the dopant element. Commercially available powdered vanadium carbide is heat-treated as below to adjust the specific surface.

(1) Powdered vanadium carbide of which purity is 99.5%, average primary particle size is 1.2 μm is prepared.
(2) The specific surface of the powdered vanadium carbide is measured by the BET method using nitrogen gas. The specific surface is 4.1 $m^2/g$.
(3) 1.4 g of the powdered vanadium carbide is put in a high purity graphite crucible and heat-treated using a resistance heating furnace (graphite heater) in an argon atmosphere for 4 hours at 2000° C.
(4) The heat-treated solid material containing the dopant element removed from the graphite crucible and the vanadium contained in the solid material containing the dopant element is confirmed using qualitative X-ray analysis.
(5) The solid material containing the dopant element is ground using a mortar and pestle, both of which are made of SiC, to the size of about 0.5-1 mm, then mixed with the SiC material. The specific surface of the solid material containing the dopant element after being ground is 0.048 $m^2/g$ (measured with the BET method using nitrogen gas).

(6) The SiC powder and the solid material containing the dopant element are mixed so that the mixture ratio by mass is: SiC powder:solid material containing dopant element=100: 0.073.

(7) The mixture, referred to as sublimation material 2, is subjected to a crystal growing process using the apparatus shown in FIG. 1 as follows. A monocrystalline SiC wafer of 100 mm in diameter made of 6H single polytype having {0001} plane is prepared as a seed crystal 1 and fixed to the inner surface of the graphite lid 4 so as to provide a Si growing face. The sublimation material 2 is put in the graphite crucible 3. The graphite crucible 3 and the graphite lid 4 are both wrapped with graphite felt 7 for heat-shielding and set on a graphite supporting rod 6 inside a double quartz tube 5. After the quartz tube 5 is evacuated by a vacuum pump 11, up to less than $1.0 \times 10^{-4}$ Pa of Ar gas of which purity is 99.9999% or more is supplied being controlled through a tube 9 and an Ar gas mass flow controller 10. The graphite crucible is heated by turning on a work coil 8 with a high frequency current to 2400° C., which is the target temperature of the bottom part of the graphite crucible, while keeping the pressure inside the quartz tube at $8.0 \times 10^4$ Pa. The temperature of the crucible is measured by a two-color pyrometer through 2-15 mm diameter optical paths formed in the graphite felt 7 at the positions of the top and the bottom portion of the crucible. The temperature of the top portion represents the seed crystal temperature and the temperature of the bottom represents the raw material temperature. Then, the pressure inside the quartz tube is reduced to $1.3 \times 10^3$ Pa over 15 minutes, and is maintained for 20 hours to carry out crystal growth.

Figure 2:
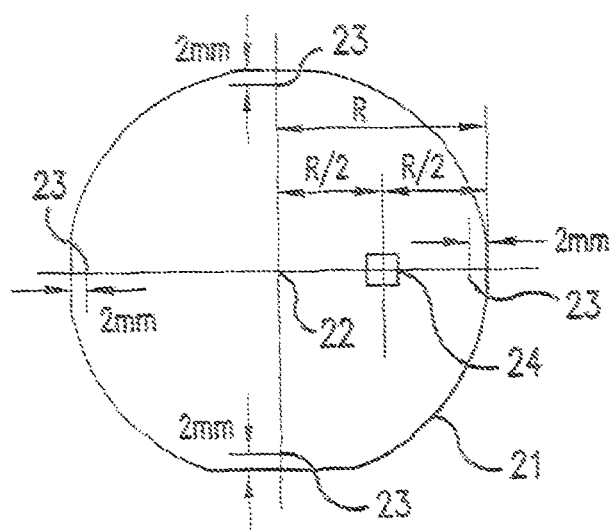
FIG. 2 is a schematic diagram showing positions for analyzing a monocrystalline SiC wafer.

As a result, a monocrystalline SiC ingot, 19 mm in height and 100 mm in diameter, is obtained. The polytype of the ingot is analyzed by X-ray diffraction and Raman scattering and it is confirmed that a 6H polytype has been grown. The ingot is worked to make 8 wafers, each of which has a thickness of 0.4 mm and has a {0001} plane. The wafer is analyzed with respect to crystal quality and physical properties. Wafer numbers 1-8 are allocated to each respective wafer from the seed crystal side in order. The relative positions of each of wafer Nos. 1-8 to the ingot total height is represented as 0.1-0.8 (relative position 0.0 corresponds to position of surface of the seed crystal and 1.0 corresponds to 19 mm of the ingot total height (top of ingot)). The polytype of each wafer is also analyzed by X-ray diffraction and Raman scattering, and it is confirmed that all the wafers are made of a 6H single polytype. The quality of the crystal of the wafer is also evaluated using a microscope and polarizing viewer to confirm that no precipitation is found by microscopic observation. All of the wafers are found to have a good crystal quality in view of the polarized image thereof. Further, the vanadium concentration and concentration of impurities are measured at the five points shown in FIG. 2 as a central portion 22 (at one measuring point) and peripheral portions 23 (at four measuring points) using Secondary Ion Mass Spectrometry (SIMS). According to the reference "R. G. Wilson et al., Secondary Ion Mass Spectrometry: A Practical Handbook For Depth Profiling And Bulk Impurity Analysis (1989)", the lower limit of measuring vanadium is $1.5 \times 10^{14}$ atoms/cm$^3$. In the present invention, a similar measuring method is employed and the lower limit of measuring vanadium is about $5 \times 10^{14}$ atoms/cm$^3$. By conducting the above-described analysis, the crystal quality and the concentration of impurities of the entire ingot can be understood with sufficient certainty. Furthermore, the measurement of electric resistivity is conducted using the Van der Pauw method with respect to a test piece having a size of 4 mm×4 mm, which is taken from position 24 shown in FIG. 2.

TABLE 1 shows the maximum and minimum values of each of vanadium concentration and uncompensated impurities concentration (|concentration of n-type impurities other than vanadium−concentration of p-type impurities other than vanadium|), and resistivity at room temperature. In each wafer, the maximum values of vanadium concentration and uncompensated impurities concentration are always provided from a measuring point of the central portion of the wafer and the minimum values are those obtained from one measuring point in the peripheral portion. The primary impurity in the crystal is nitrogen and the conductivity type by the impurities is n-type. The maximum concentration of vanadium among all the measuring points is, from the central portion of wafer No. 1, $2.09 \times 10^{17}$ atoms/cm$^3$, which is less than the solubility limit. The minimum concentration of vanadium is, from the peripheral portion of wafer No. 8, $1.40 \times 10^{17}$ atoms/cm$^3$, thus, the maximum value is 1.49 times that of the minimum value. At all of the measuring points of all of the wafers, the vanadium concentration is always greater than the uncompensated impurities concentration. All measured resistivities at room temperature are $1 \times 10^8$ Ωcm or more. In this invention, the maximum values and the minimum values of the dopant concentration (e.g., vanadium concentration) are determined among the values measured at the above-mentioned 5 points. Also the "electric resistivity" at room temperature is, e.g., $1 \times 10^5$ Ωcm or more, which means all of the measured values with 8 wafers above-mentioned are $1 \times 10^5$ Ωcm or more.

TABLE 1

| Wafer no. | | Concentration of uncompensated impurities | Concentration of vanadium | Resistivity at room temperature |
|---|---|---|---|---|
| 1 | maximum | $1.29 \times 10^{17}$ atoms/cm$^3$ | $1.63 \times 10^{17}$ atoms/cm$^3$ | $7.51 \times 10^8$ Ωcm |
|   | minimum | $1.26 \times 10^{17}$ atoms/cm$^3$ | $1.40 \times 10^{17}$ atoms/cm$^3$ | |
| 2 | maximum | $6.69 \times 10^{16}$ atoms/cm$^3$ | $1.66 \times 10^{17}$ atoms/cm$^3$ | $1.25 \times 10^9$ Ωcm |
|   | minimum | $5.48 \times 10^{16}$ atoms/cm$^3$ | $1.45 \times 10^{17}$ atoms/cm$^3$ | |
| 3 | maximum | $3.36 \times 10^{16}$ atoms/cm$^3$ | $1.69 \times 10^{17}$ atoms/cm$^3$ | $1.52 \times 10^{10}$ Ωcm |
|   | minimum | $3.06 \times 10^{16}$ atoms/cm$^3$ | $1.49 \times 10^{17}$ atoms/cm$^3$ | |
| 4 | maximum | $1.95 \times 10^{16}$ atoms/cm$^3$ | $1.74 \times 10^{17}$ atoms/cm$^3$ | $1.85 \times 10^{10}$ Ωcm |
|   | minimum | $1.73 \times 10^{16}$ atoms/cm$^3$ | $1.53 \times 10^{17}$ atoms/cm$^3$ | |
| 5 | maximum | $1.44 \times 10^{16}$ atoms/cm$^3$ | $1.82 \times 10^{17}$ atoms/cm$^3$ | $5.06 \times 10^{10}$ Ωcm |
|   | minimum | $1.25 \times 10^{16}$ atoms/cm$^3$ | $1.61 \times 10^{17}$ atoms/cm$^3$ | |
| 6 | maximum | $1.15 \times 10^{16}$ atoms/cm$^3$ | $1.84 \times 10^{17}$ atoms/cm$^3$ | $8.33 \times 10^{10}$ Ωcm |
|   | minimum | $1.02 \times 10^{16}$ atoms/cm$^3$ | $1.74 \times 10^{17}$ atoms/cm$^3$ | |
| 7 | maximum | $1.02 \times 10^{16}$ atoms/cm$^3$ | $1.85 \times 10^{17}$ atoms/cm$^3$ | $2.06 \times 10^{11}$ Ωcm |
|   | minimum | $9.80 \times 10^{15}$ atoms/cm$^3$ | $1.79 \times 10^{17}$ atoms/cm$^3$ | |
| 8 | maximum | $9.07 \times 10^{15}$ atoms/cm$^3$ | $2.09 \times 10^{17}$ atoms/cm$^3$ | $5.32 \times 10^{11}$ Ωcm |
|   | minimum | $8.73 \times 10^{15}$ atoms/cm$^3$ | $1.92 \times 10^{17}$ atoms/cm$^3$ | |

Example 2

Figure 3:
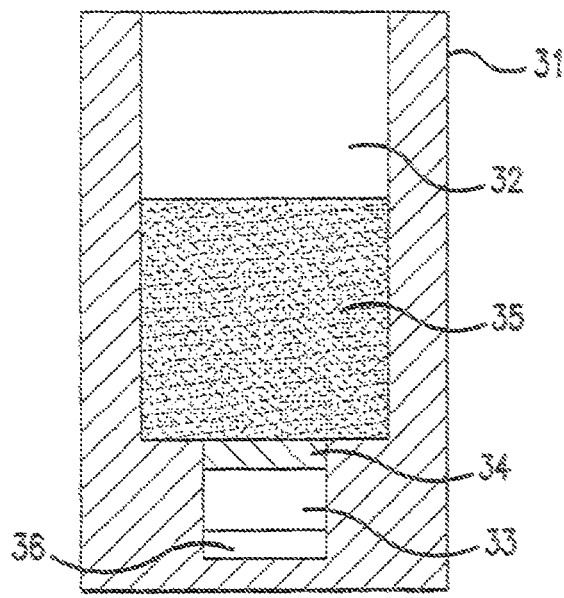
FIG. 3 is a schematic diagram of a crucible accommodating space used for conducting a pre-heat-treatment of solid material containing a dopant element, which treatment is incorporated in the manufacturing process of monocrystalline SiC.

Example 2 explains the case where the process of heat-treating the solid material containing the dopant element is incorporated in the manufacturing process of a monocrystalline SiC ingot. The crucible and sublimation raw material used for crystal growth is as shown in FIG. 3. The graphite crucible 31 has two independent spaces for accommodating raw materials, i.e., a first space 32 and a second space 33. A graphite lid 34 is fixed to the graphite crucible 31 with screws to separate the first space 32 and second space 33 from each other. The first space 32 accommodates the Sit material 35 and the second space 33 accommodates the solid material containing the vanadium element 36. The amount of solid material containing the dopant element to be accommodated is 0.15 parts by mass to 100 parts by mass of the SiC material 35. The solid material containing the dopant element 36 is a mixture of pure vanadium powder and high purity graphite powder, of which mass ratio is 100 of pure vanadium to 20 of high purity graphite. The purity of the pure vanadium powder is 99.95% and the specific surface measured is 2.4 m$^2$/g (BET method using nitrogen gas). The crucible 31 having the raw material inside is set in the crystal growing apparatus of FIG. 1 in place of the crucible 3 and the sublimation raw material 2. A monocrystalline SiC wafer of 51 mm in diameter made of a 4H single polytype having a {0001} plane is prepared as a seed crystal 1 and C face is set as a growing face. Same as in the process of example 1, after the quartz tube 5 is evacuated, up to less than 1.0×10$^{-4}$ Pa high purity Ar gas is supplied and the graphite crucible is heated by turning on a work coil with a high frequency current to the temperature for heat-treating the solid material containing the dopant element while maintaining the pressure inside the quartz tube at 8.0×10$^4$ Pa. This heat-treating is carried out for 2 hours at 1800° C. Before starting crystal growth, the heat-treated solid material containing the dopant element is analyzed. Qualitative X-ray analysis indicates that the heat-treated material contains vanadium and the BET method using nitrogen gas indicates that the specific surface is 0.026 m$^2$/g. Then, the temperature is increased to 2400° C. of the crystal growing temperature and the pressure inside the quartz tube is reduced to 1.3×10$^3$ Pa over 15 minutes. Then, then these conditions are maintained for 20 hours to carry out crystal growth.

Figure 4:
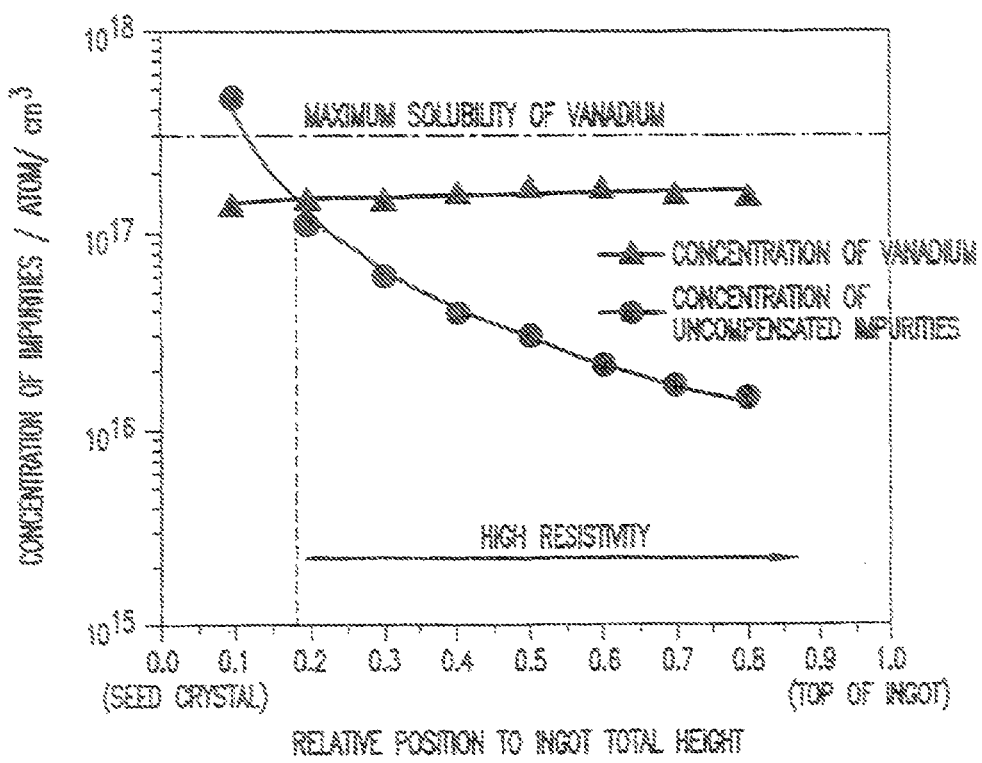
FIG. 4 is a graph showing the concentration of impurities in the crystal of Example 2.

As a result, a monocrystalline SiC ingot, 51 mm in diameter and 17 mm in height is obtained. The polytype of the ingot is analyzed by X-ray diffraction and Raman scattering and it is confirmed that a 4H polytype has been grown. The ingot is worked to make 8 wafers each of which has a diameter of 51 mm, a thickness of 0.4 mm and a {0001} plane. Same as in example 1, the relative position of each of the wafers No. 1-8 to the ingot total height is represented as 0.1-0.8 (relative position 0.0 corresponds to the position of the surface of the seed crystal and 1.0 corresponds to 17 mm of the ingot total height (top of ingot)). The polytype of each wafer is also analyzed by X-ray diffraction and Raman scattering and it is confirmed that all of the wafers are made of a 4H single polytype. It is also confirmed that no precipitation is found by microscopic observation and all of the wafers are found to have a good crystal quality in view of the polarized image thereof. Further, the vanadium concentration and impurities concentration are measured at the five points shown in FIG. 2 as a central portion 22 (at one point) and peripheral portions 23 (at four points) using SIMS. Furthermore, measurement of electric resistivity is conducted using the Van der Pauw method with respect to a test piece taken from position 24 shown in FIG. 2. TABLE 2 shows the maximum and the minimum values of each of vanadium concentration and uncompensated impurities concentration (|concentration of n-type impurities other than vanadium−concentration of p-type impurities other than vanadium|), and resistivity at room temperature. FIG. 4 is a graph showing the results of the analysis of impurities in the central area of each wafer. The maximum concentration of vanadium is obtained at one measuring point in the peripheral portion, and the maximum concentration of uncompensated impurities is obtained from the measuring point in the central portion. The primary impurity in the crystal is nitrogen and the conductivity type by the impurities is n-type. The maximum concentration of vanadium among all of the measuring points is, from the peripheral portion of wafer No. 6, 1.72×10$^{17}$ atoms/cm$^3$ and the minimum concentration of vanadium is, from the central portion of wafer No. 1, 1.40×10$^{17}$ atoms/cm$^3$. Thus, the maximum value is 1.23 times that of the minimum value. With respect to the wafers of No. 2 to No. 8, the vanadium concentration at all the measuring points is greater than the uncompensated impurities concentration and the measured resistivities at room temperature are 1×10$^9$ Ωcm or more.

TABLE 2

| Wafer no. | | Concentration of uncompensated impurities | Concentration of vanadium | Resistivity at room temperature |
|---|---|---|---|---|
| 1 | maximum | 4.34 × 10$^{17}$ atoms/cm$^3$ | 1.47 × 10$^{17}$ atoms/cm$^3$ | 1.52 × 10$^1$ Ωcm |
|   | minimum | 1.85 × 10$^{17}$ atoms/cm$^3$ | 1.40 × 10$^{17}$ atoms/cm$^3$ | |
| 2 | maximum | 1.16 × 10$^{17}$ atoms/cm$^3$ | 1.48 × 10$^{17}$ atoms/cm$^3$ | 8.14 × 10$^9$ Ωcm |
|   | minimum | 6.82 × 10$^{16}$ atoms/cm$^3$ | 1.46 × 10$^{17}$ atoms/cm$^3$ | |
| 3 | maximum | 6.06 × 10$^{16}$ atoms/cm$^3$ | 1.54 × 10$^{17}$ atoms/cm$^3$ | 5.64 × 10$^{10}$ Ωcm |
|   | minimum | 4.30 × 10$^{16}$ atoms/cm$^3$ | 1.45 × 10$^{17}$ atoms/cm$^3$ | |
| 4 | maximum | 4.29 × 10$^{16}$ atoms/cm$^3$ | 1.62 × 10$^{17}$ atoms/cm$^3$ | 5.81 × 10$^{10}$ Ωcm |
|   | minimum | 3.09 × 10$^{16}$ atoms/cm$^3$ | 1.57 × 10$^{17}$ atoms/cm$^3$ | |
| 5 | maximum | 3.52 × 10$^{16}$ atoms/cm$^3$ | 1.71 × 10$^{17}$ atoms/cm$^3$ | 3.15 × 10$^{11}$ Ωcm |
|   | minimum | 2.57 × 10$^{16}$ atoms/cm$^3$ | 1.69 × 10$^{17}$ atoms/cm$^3$ | |
| 6 | maximum | 2.28 × 10$^{16}$ atoms/cm$^3$ | 1.72 × 10$^{17}$ atoms/cm$^3$ | 4.61 × 10$^{11}$ Ωcm |
|   | minimum | 1.73 × 10$^{16}$ atoms/cm$^3$ | 1.63 × 10$^{17}$ atoms/cm$^3$ | |
| 7 | maximum | 1.75 × 10$^{16}$ atoms/cm$^3$ | 1.68 × 10$^{17}$ atoms/cm$^3$ | 6.06 × 10$^{11}$ Ωcm |
|   | minimum | 1.40 × 10$^{16}$ atoms/cm$^3$ | 1.54 × 10$^{17}$ atoms/cm$^3$ | |
| 8 | maximum | 1.65 × 10$^{16}$ atoms/cm$^3$ | 1.61 × 10$^{17}$ atoms/cm$^3$ | 7.23 × 10$^{11}$ Ωcm |
|   | minimum | 1.36 × 10$^{16}$ atoms/cm$^3$ | 1.49 × 10$^{17}$ atoms/cm$^3$ | |

Comparative Example

Figure 5:
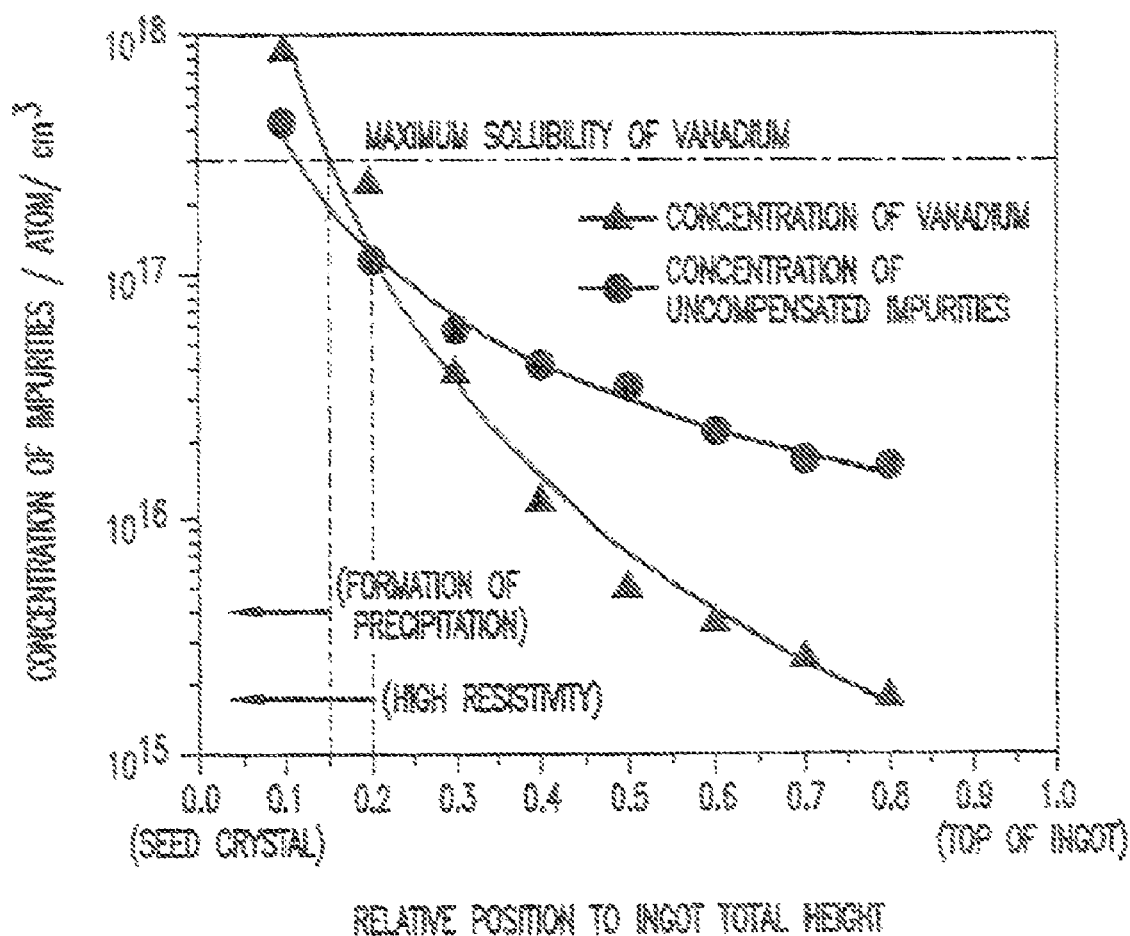
FIG. 5 is a graph showing the concentration of impurities in the crystal of the comparative example.

As a comparative example, the manufacture of vanadium-added monocrystalline SiC by a conventional method is explained below. The SiC powder and the solid material containing the dopant element are mixed so that the mixture ratio by mass is to be: SiC powder:vanadium carbide powder=100:

0.05. This is to be used as the sublimation material 2 shown in FIG. 1, wherein the vanadium carbide powder has a purity of 99.5%, an average primary particle size of 1.2 μm and a specific surface of 4.1 m²/g. As a seed crystal 1, a monocrystalline SiC wafer of 51 mm in diameter made of a 4H single polytype having a {0001} plane is prepared and C face is to be as growing face. After an evacuation and replacement with Ar gas are made, crystal growth is carried out with the C face as growing face for 20 hours at 2400° C. As a result, a monocrystalline SiC ingot, 51 mm in diameter and 17 mm in height is obtained. The polytype of the ingot is analyzed by X-ray diffraction and Raman scattering and it is confirmed that a 4H polytype has been grown. The ingot is worked to make 8 wafers each of which has a diameter of 51 mm, a thickness of 0.4 mm and {0001} plane. The relative position of each of the 8 wafers to the ingot total height is represented as 0.1-0.8 (relative position 1.0 corresponds to 17 mm of the ingot total height (top of ingot)). It is confirmed that precipitation, which is thought to be vanadium carbide precipitate, is found in wafer No. 1 by microscopic observation. Further, a polarized image of the wafer shows that dislocations pile up around the precipitates to form crystal defects of hypo-grain-boundary, which is succeeded in the following crystal growth process to form the same crystal defect of sub-boundary at the same position in wafer No. 8. Further, the vanadium concentration and the impurities concentration are measured at the five points shown in FIG. 2 as the central portion 22 (at one point) and the peripheral portions 23 (at four points) using SIMS. Furthermore, measurement of electric resistivity is conducted using the Van der Pauw method with respect to a test piece taken from position 24 shown in FIG. 2. TABLE 3 shows the maximum and the minimum values of each of the vanadium concentration and the uncompensated impurities concentration (|concentration of n-type impurities other than vanadium−concentration of p-type impurities other than vanadium|), and the resistivity at room temperature. Both the maximum concentration of vanadium and the maximum concentration of uncompensated impurities are obtained from a measuring point in the central portion. FIG. 5 is a graph showing the results of an analysis of the impurities in the central area of each wafer. The primary impurity in the obtained crystal is nitrogen and the conductivity type by the impurities is n-type. With respect to the vanadium concentration, the central portion of the wafer No. 1 has a maximum value $8.78 \times 10^{17}$ atoms/cm³, one measurement point of the peripheral portion of wafer No. 8 has a minimum value $1.70 \times 10^{15}$ atoms/cm³. The maximum value exceeds the maximum solubility (solubility limit) of vanadium and the maximum value is 516 times that of the minimum value. Wafers No. 1 and No. 2, where the vanadium concentration exceeds the uncompensated impurities concentration, have a resistivity at room temperature of $1 \times 10^9$ Ωcm or more, but the resistivity at room temperature of the rest of wafers is less than $1 \times 10^3$ Ωcm.

TABLE 3

| Wafer no. | | Concentration of uncompensated impurities | Concentration of vanadium | Resistivity at room temperature |
|---|---|---|---|---|
| 1 | maximum | $4.34 \times 10^{17}$ atoms/cm³ | $8.78 \times 10^{17}$ atoms/cm³ | $1.79 \times 10^9$ Ωcm |
|   | minimum | $1.85 \times 10^{17}$ atoms/cm³ | $3.86 \times 10^{17}$ atoms/cm³ | |
| 2 | maximum | $1.16 \times 10^{17}$ atoms/cm³ | $2.50 \times 10^{17}$ atoms/cm³ | $9.49 \times 10^9$ Ωcm |
|   | minimum | $6.82 \times 10^{16}$ atoms/cm³ | $9.40 \times 10^{16}$ atoms/cm³ | |
| 3 | maximum | $6.06 \times 10^{16}$ atoms/cm³ | $4.09 \times 10^{16}$ atoms/cm³ | $8.24 \times 10^2$ Ωcm |
|   | minimum | $4.30 \times 10^{16}$ atoms/cm³ | $2.69 \times 10^{16}$ atoms/cm³ | |
| 4 | maximum | $4.29 \times 10^{16}$ atoms/cm³ | $1.22 \times 10^{16}$ atoms/cm³ | $3.35 \times 10^2$ Ωcm |
|   | minimum | $3.09 \times 10^{16}$ atoms/cm³ | $1.14 \times 10^{16}$ atoms/cm³ | |
| 5 | maximum | $3.52 \times 10^{16}$ atoms/cm³ | $5.31 \times 10^{15}$ atoms/cm³ | $6.87 \times 10^1$ Ωcm |
|   | minimum | $2.57 \times 10^{16}$ atoms/cm³ | $4.57 \times 10^{15}$ atoms/cm³ | |
| 6 | maximum | $2.28 \times 10^{16}$ atoms/cm³ | $3.78 \times 10^{15}$ atoms/cm³ | $5.24 \times 10^1$ Ωcm |
|   | minimum | $1.73 \times 10^{16}$ atoms/cm³ | $3.34 \times 10^{15}$ atoms/cm³ | |
| 7 | maximum | $1.75 \times 10^{16}$ atoms/cm³ | $2.65 \times 10^{15}$ atoms/cm³ | $5.56 \times 10^1$ Ωcm |
|   | minimum | $1.40 \times 10^{16}$ atoms/cm³ | $2.25 \times 10^{15}$ atoms/cm³ | |
| 8 | maximum | $1.65 \times 10^{16}$ atoms/cm³ | $1.84 \times 10^{15}$ atoms/cm³ | $6.48 \times 10^1$ Ωcm |
|   | minimum | $1.36 \times 10^{16}$ atoms/cm³ | $1.70 \times 10^{15}$ atoms/cm³ | |

The effects of the present invention are described below. FIG. 4 shows the impurities concentration and the vanadium concentration in the monocrystalline SiC ingot of example 2. The vanadium concentration is lower than the maximum solubility (solubility limit) over the entire ingot and no precipitation is found. A wafer with high crystal quality and high resistivity can be produced from a large portion of the ingot of relative height (position) 0.2 or more. FIG. 5 shows the impurities concentration and the vanadium concentration in the monocrystalline SiC ingot of the comparative example made by a conventional method. The vanadium concentration is very high in the position close to the seed crystal and precipitation of vanadium compounds exist between 0 and 0.15 of relative height (position). From this ingot, a high resistivity wafer can be produced from the portion of which relative position is 0.2 or less where the vanadium concentration is higher than the uncompensated impurities concentration. However, the crystal quality is low for the entire ingot because of precipitates formed during an early stage of growth.

Example 3

A mirror surface wafer, of 50 mm in diameter and 360 μm in thickness, having face orientation off-angled by 4 degrees from a {0001} plane toward <11-20> direction is made using the ingot made by the same process as example 2. Using this mirror wafer as a substrate, epitaxial growth of SiC is performed. The growing conditions of the SiC epitaxial thin film are such that the growing temperature is 1520° C., and the flow rate of each of silane ($SiH_4$), propane ($C_3H_8$), and hydrogen ($H_2$) are $5.0 \times 10^{-9}$ m³/sec., $3.3 \times 10^{-9}$ m³/sec. and $5.0 \times 10^{-5}$ m³/sec., respectively. The growing pressure is atmospheric pressure. After 2 hours of growth, a thin film of about 5 μm thickness is formed. This epitaxial thin film is observed using a Normarski optical microscope and it is found that a high quality SiC epitaxial thin film is formed. This has almost no surface defects, such as pitting, and has excellent surface morphology.

A mirror surface wafer, of 50 mm in diameter and 360 μm in thickness, having face orientation exactly the same as a {0001} plane is made using another ingot made by the same process as example 2. Using this mirror wafer as a substrate, a gallium nitride thin film is formed by epitaxial growth using a metalorganic chemical vapor deposition (MOCVD) method. The growing conditions of the gallium nitride thin film are such that the growing temperature is 1050° C., and the flow rate of each of trimethylgallium (TMG), ammonia ($NH_3$), and silane ($SiH_4$), are $54 \times 10^{-6}$ mol/min., 4 liter/min. and $22 \times 10^{-11}$ mol/min., respectively. The growing pressure is atmospheric pressure. After 60 minutes of growth, a n-type gallium nitride thin film of about 3 μm in thickness is formed. This epitaxial thin film is observed using a Normarski optical microscope and it is found that a high quality gallium nitride epitaxial thin film is formed, which has very flat morphology.

All cited patents, publications, copending applications, and provisional applications referred to in this application are herein incorporated by reference.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for manufacturing a monocrystalline silicon carbide comprising a step of:
   growing a monocrystalline silicon carbide on a seed crystal from a sublimation material by a sublimation method, wherein the sublimation material includes a solid material containing a dopant element, and wherein a specific surface of the solid material containing the dopant element is 0.5 $m^2$/g or less.

2. A method for manufacturing a monocrystalline silicon carbide comprising a step of:
   growing a monocrystalline silicon carbide on a seed crystal from a sublimation material by a sublimation method, wherein the sublimation material includes a solid material containing a dopant element, and wherein the solid material containing the dopant element can reduce the specific surface to 0.5 $m^2$/g or less at a temperature of 2400° C. or less.

3. The method for manufacturing a monocrystalline silicon carbide according to claim 1, wherein the sublimation material is a mixture of the solid material containing the dopant element and silicon carbide powder or silicon carbide raw material powder prepared in advance.

4. The method for manufacturing a monocrystalline silicon carbide according to claim 1, wherein the sublimation material consists of the solid material containing the dopant element and silicon carbide powder or silicon carbide raw material powder where the solid material containing dopant element and the silicon carbide powder or the silicon carbide raw material powder are placed separately from each other.

5. The method for manufacturing a monocrystalline silicon carbide according to claim 1, wherein the solid material containing the dopant element has a specific surface of 0.1 $m^2$/g or less.

6. The method for manufacturing a monocrystalline silicon carbide according to claim 1, wherein the solid material containing the dopant element has a specific surface of 0.05 $m^2$/g or less.

7. The method for manufacturing a monocrystalline silicon carbide according to claim 1, wherein the dopant element is vanadium.

8. A method for forming a monocrystalline silicon carbide (SiC) on a seed crystal of monocrystalline SiC by sublimation-re-crystallizing a sublimation material under reduced pressure of an inert gas atmosphere, wherein the sublimation material includes SiC and solid material containing vanadium as a dopant element which ranges from 0.001 to 1.0 weigh % of SiC in terms of vanadium comprising steps of:
   (a) treating the vanadium carbide as the dopant so as to adjust a specific surface of the vanadium carbide to 0.001 $m^2$/g or more and 0.5 $m^2$/g or less, and
   (b) sublimation-re-crystallizing the sublimation material to form the monocrystalline SiC on the seed crystal of monocrystalline SiC.

9. The method according to claim 8, wherein the sublimation material consists of SiC and vanadium carbide excluding any acceptor element for transforming a conductivity type of monocrystalline SiC to p-type.

10. The method according to claim 8, wherein the step of sublimation-re-crystallizing is conducted after mixing the vanadium carbide of which specific surface is 0.001 $m^2$/g or more and 0.5 $m^2$/g or less with SiC.

11. The method according to claim 8, wherein the step of sublimation-re-crystallizing is conducted by increasing the temperature both of the solid material containing vanadium as a dopant element and the SiC after the solid material and the SiC are placed separately and then is heated to a temperature below 2400° C. so that the specific surface becomes 0.001 $m^2$/g or more and 0.5 $m^2$/g or less.

12. The method according to claim 8, wherein the step of treating the vanadium carbide as the dopant so as to adjust a specific surface of the vanadium carbide to 0.001 $m^2$/g or more and 0.5 $m^2$/g or less includes heat treatment.

13. The method according to claim 12, wherein the heat treatment is sintering or melting.

* * * * *